United States Patent

Harvey

[11] Patent Number: 5,578,967
[45] Date of Patent: Nov. 26, 1996

[54] CIRCUIT COMPENSATING FOR CAPACITANCE AT INVERTING INPUT OF CURRENT FEEDBACK AMPLIFIER

[75] Inventor: Barry Harvey, Los Altos, Calif.

[73] Assignee: Elantec, Milpitas, Calif.

[21] Appl. No.: 535,936

[22] Filed: Sep. 28, 1995

[51] Int. Cl.⁶ .................................................. H03F 3/30
[52] U.S. Cl. .................................. 330/263; 330/265
[58] Field of Search ................................ 330/151, 263, 330/265, 292

[56] References Cited

U.S. PATENT DOCUMENTS

| | | | |
|---|---|---|---|
| 4,513,178 | 4/1985 | Hng et al. ................................ | 179/81 |
| 4,713,628 | 12/1987 | Nelson ...................................... | 330/254 |
| 4,792,977 | 12/1988 | Anderson et al. ...................... | 381/68.4 |
| 4,806,882 | 2/1989 | Gehring et al. ......................... | 331/65 |
| 4,820,971 | 4/1989 | Ko et al. .................................. | 324/61 |
| 5,177,451 | 1/1993 | Lehmann ............................ | 330/263 X |
| 5,179,355 | 1/1993 | Harvey .................................... | 330/265 |
| 5,229,721 | 7/1993 | Stade ....................................... | 330/265 |
| 5,418,495 | 5/1995 | Harvey .................................... | 330/265 |

Primary Examiner—James B. Mullins
Attorney, Agent, or Firm—Fliesler, Dubb, Meyer & Lovejoy

[57] ABSTRACT

A capacitance compensation circuit for a current feedback amplifier which compensates for error current created due to a parasitic capacitance $C_{IN}$ on the negative, or inverting input terminal $V_{IN}$. The capacitance compensation circuit includes a capacitor C* connected to the positive input terminal $V_{IN+}$ utilized to couple current from $V_{IN+}$ to the collectors of emitter follower transistors having bases coupled to $V_{IN+}$ and emitters connected to $V_{IN-}$.

8 Claims, 4 Drawing Sheets

CIRCUIT COMPENSATING FOR CAPACITANCE AT INVERTING INPUT OF CURRENT FEEDBACK AMPLIFIER

BACKGROUND OF THE INVENTION

1. Field of the Invention

This invention relates to current feedback amplifiers. More particularly, this invention relates to circuitry to eliminate the peaking of gain at high frequencies due to parasitic capacitance at the negative, or inverting input terminal of a current feedback amplifier.

2. Description of the Related Art

FIG. 1 shows a conventional current feedback amplifier circuit. The circuitry includes an input stage formed by two complementary buffers including four transistors 101–104, two current sources 106 and 108 and two current mirrors 120 and 130. The circuitry further includes an output stage formed by output buffer 140. Feedback for the amplifier is provided by an external feedback resistor $R_F$, while gain is controlled by a gain control resistor $R_G$ and compensation is provided by capacitor $C_{COMP}$.

In the input stage, the transistors 101 and 102 are complementary and have bases connected to serve as a positive input terminal $V_{IN+}$ for the amplifier. The collector of transistor 101 is connected to a negative power supply V−, while the collector of transistor 102 is connected to a positive power supply V+. Transistors 101 and 102 are biased into conduction by current sources 106 and 108 connected to their respective emitters. The emitter follower transistors 103 and 104 of the input stage each have a base connected to an emitter of a complementary transistor in transistors 101 and 102 and an emitter connected to a negative, or inverting input terminal $V_{IN-}$. The current mirrors 120 and 130 of the input stage have inputs $I_{IN}$ connected to respective collectors of the second pair of transistors 103 and 104 and outputs $I_{OUT}$ which mirror currents at their respective inputs $I_{IN}$ connected to form a gain node G.

The output buffer 140 is connected between gain node G and the amplifier output terminal $V_{OUT}$. The feedback resistor $R_F$ is connected between the amplifier output terminal $V_{OUT}$ and $V_{IN-}$. The gain control resistor $R_G$ connects from the negative input terminal $V_{IN-}$ to ground to control amplifier gain.

A capacitance $C_{IN}$ is not intentionally connected, but is a parasitic capacitance from $V_{IN-}$ to ground. Compensation capacitor $C_{COMP}$ is intentionally connected from the high capacitance gain node G to ground to control the gain vs. frequency characteristics of the amplifier.

In operation, transistors 101–104 buffer the voltage at $V_{IN+}$ and present it to $V_{IN-}$. An error current is provided at the negative input terminal $V_{IN-}$ by resistors $R_F$ and $R_G$ which form a voltage divider feedback circuit to divide the voltage at the amplifier output terminal $V_{OUT}$ to provide a divided voltage $V_{OUT}R_G/(R_G+R_F)$. For a given output voltage at $V_{OUT}$, the error current flows into or out of the feedback circuit through $V_{IN-}$ when the voltage at $V_{IN-}$ deviates from the divided voltage, $V_{OUT}R_G/(R_G+R_F)$.

With increasing frequency, capacitances have an increasing effect on gain. Compensation capacitor $C_{COMP}$ is provided to dominate other capacitances in the circuitry to control the amplifier gain characteristics with increasing frequency as shown by curve 202 of FIG. 2. With $C_{COMP}$, gain drops to the 3 dB bandwidth point at $f=1/(2\pi C_{COMP}R_F)$ as shown. As increased bandwidth is desired, $C_{COMP}$ is reduced toward the value of $C_{IN}$. With $C_{COMP}$ approaching $C_{IN}$, however, $C_{IN}$ begins to affect the amplifier output causing undesirable gain peaking beyond the expected 3 dB bandwidth of $1/(2\pi C_{COMP}R_F)$ as shown by curve 204 in FIG. 2. It is thus desirable to utilize circuitry to compensate for $C_{IN}$.

U.S. Pat. No. 5,418,495 entitled "Input Stage Improvement For Current Feedback Amplifiers", incorporated herein by reference, discloses circuitry for compensating for the capacitance $C_{IN}$ in a current feedback amplifier. FIG. 3 illustrates circuitry for compensating for the capacitance $C_{IN}$ as disclosed in U.S. Pat. No. 5,418,495. The circuitry of FIG. 3 includes components carried over from FIG. 1 with modifications. For convenience, the circuitry carried over from FIG. 1 to FIG. 3 is similarly labeled.

The circuit illustrated in FIG. 3 first adds a pair of emitter follower transistors 303 and 304, similar to emitter follower transistors 103 and 104. Transistor 303 has a base connected to the emitter of transistor 101. Transistor 304 has a base connected to the emitter of transistor 102. Unlike transistors 103 and 104 which have emitters connected to the negative input terminal $I_{IN}$, the emitters of transistors 303 and 304 are connected to a newly added capacitor C* having a value set to equal $C_{IN}$.

FIG. 3 also modifies the input stage of FIG. 1 to include a first means 320 and second means 330 for subtracting current. The subtraction means 320 has inputs connected to collectors of transistors 103 and 303 and provides an output connected to a gain node. The subtraction means 330 has inputs connected to collectors of transistors 104 and 304 and provides an output connected to a gain node. Several circuits which are available for the subtraction means 320 and 330 are disclosed in U.S. Pat. No. 5,418,495.

In operation, newly added transistors 303 and 304, subtraction means 320 and 330 and capacitor C* enable cancellation of the effects of $C_{IN}$. Subtraction means 320 subtracts the collector current of transistor 303 from the collector current of transistor 103. Similarly, subtraction means 330 subtracts the collector current of transistor 304 from the collector current of transistor 104. Since transistors 103 and 104 have collectors carrying error current components determined by $C_{IN}$ and transistors 303 and 304 have collector currents determined by capacitor C* set equal to $C_{IN}$, by subtracting the collector currents of transistor 303 from 103 and 304 from 104, errors from the signal path due to $C_{IN}$ are cancelled.

SUMMARY OF THE INVENTION

The present invention provides a circuit in addition to the circuitry of FIG. 3 to enable cancellation of the effects of $C_{IN}$ to provide a current feedback amplifier with a reliable and controllable frequency response.

The present invention includes a circuit which can be utilized with a current feedback amplifier, such as the current feedback amplifier of FIG. 1, the capacitance compensation circuit including:

a capacitor C* having a first end connected to $V_{IN+}$ of the current feedback amplifier; and a pair of emitter follower transistors, each transistor of the pair having a base connected to receive a bias voltage, an emitter connected to the second end of the capacitor C* and a collector connected to a collector of one transistor in a pair of emitter follower transistors of the current feedback amplifier, such as transistors 103 and 104 of FIG. 1.

BRIEF DESCRIPTION OF THE DRAWINGS

Further details of the present invention are explained with the help of the attached drawings in which.

DETAILED DESCRIPTION

Figure 3:
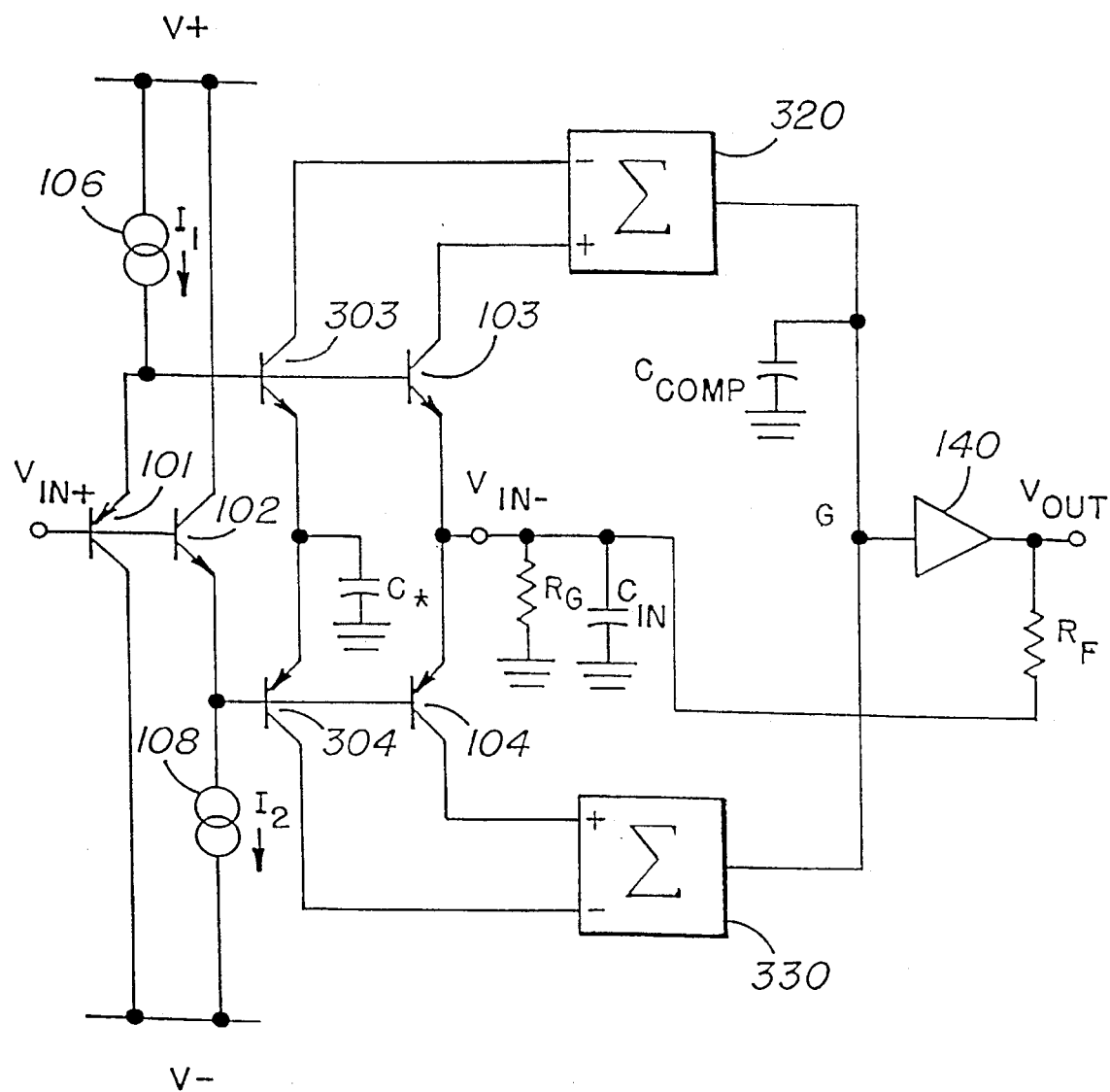
FIG. 3 shows a conventional current feedback amplifier with compensation for parasitic capacitance $C_{IN}$ at an inverting input terminal.
Figure 4:
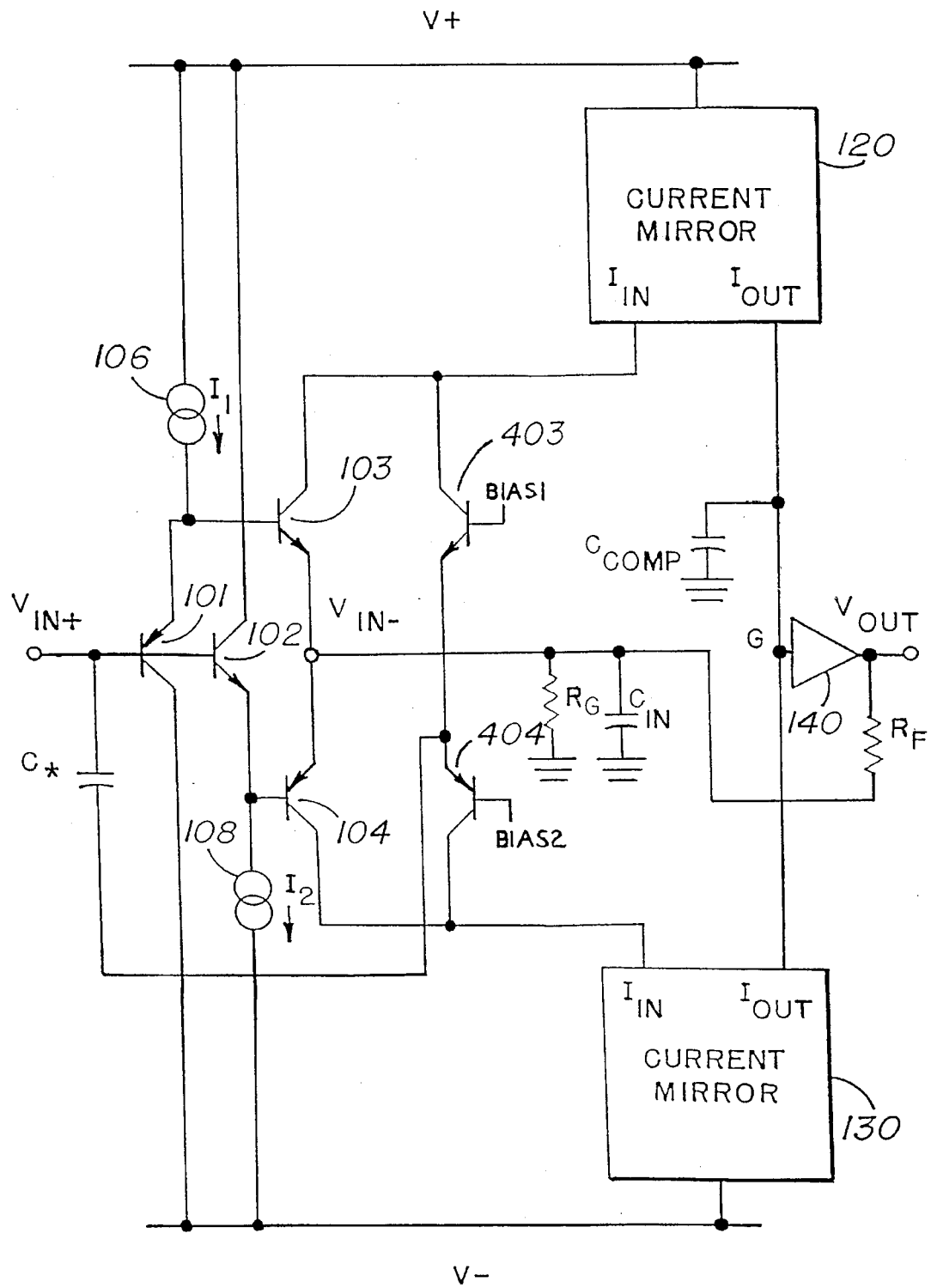
FIG. 4 shows a current feedback amplifier including the capacitance compensation circuit of the present invention.

FIG. 4 shows a current feedback amplifier including the capacitance compensation circuit of the present invention. The circuit of FIG. 4 includes components carried over from FIG. 1 with modifications. For convenience, the circuitry carried over from FIG. 1 to FIG. 4 is similarly labeled.

Figure 1:
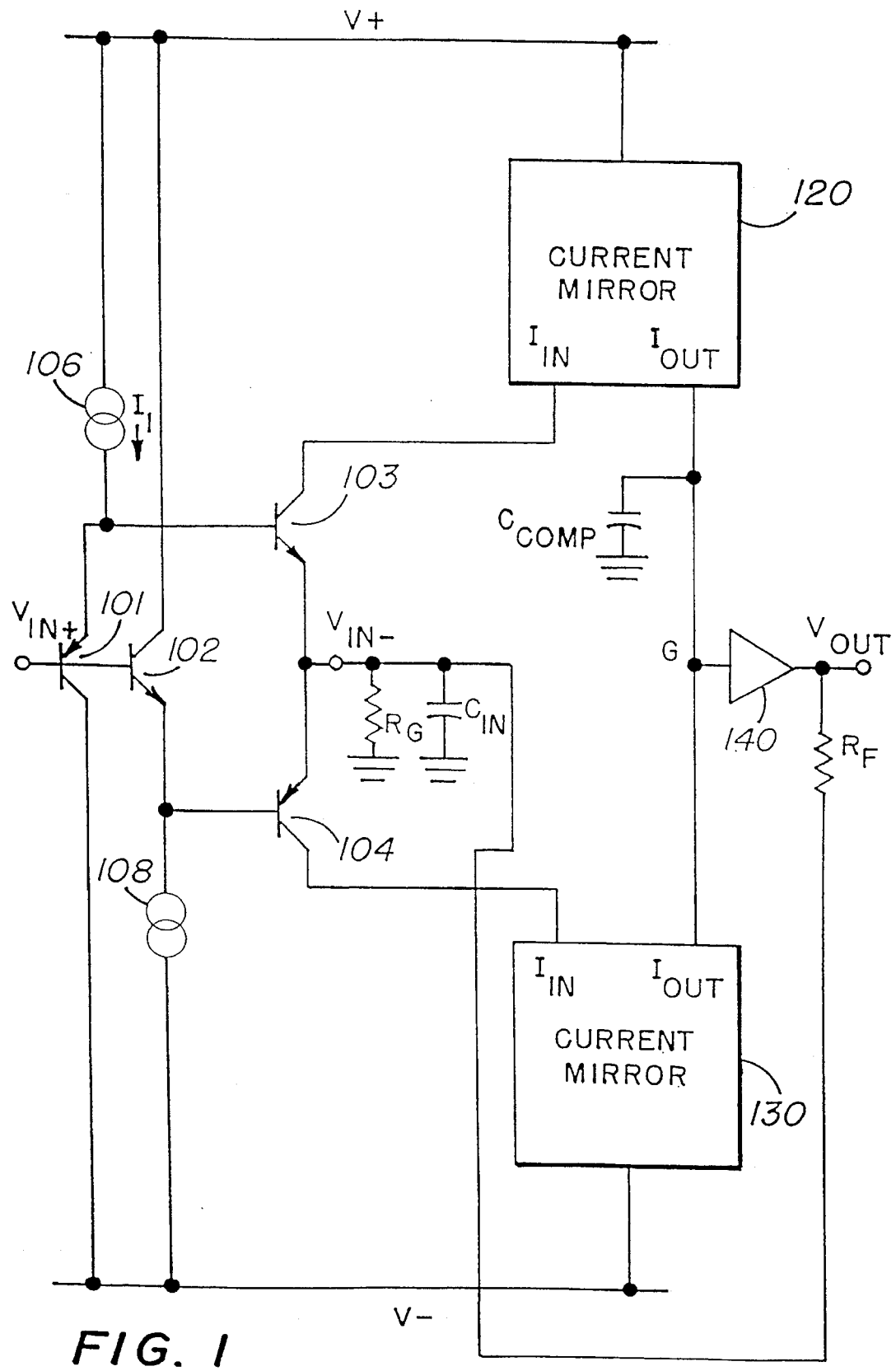
FIG. 1 shows a conventional current feedback amplifier.
Figure 2:
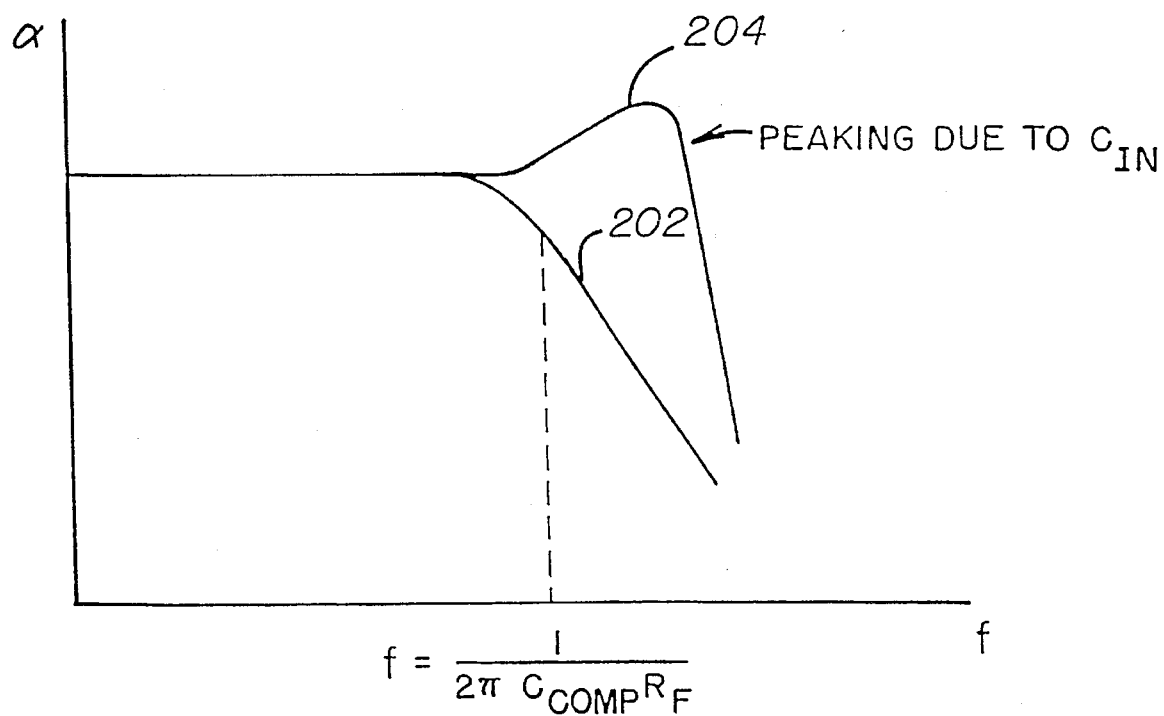
FIG. 2 shows a plot of amplifier gain versus frequency for a typical current feedback amplifier illustrating gain peaking due to $C_{IN}$.

The circuit illustrated in FIG. 4 first adds a capacitor C* to the current feedback amplifier circuit of FIG. 1. The capacitor C* has a first end connected to the negative input terminal $V_{IN+}$. C* is provided to emulate the effects of $C_{IN}$ and can be realized as a physical capacitor, or as a package pin to allow a user to adjust C* to equal $C_{IN}$.

The circuit of FIG. 4 further adds a pair of complementary emitter follower transistors 403 and 404 to the current feedback amplifier circuit of FIG. 1. Similar to transistor 103, transistor 403 is an npn transistor. Transistor 403 has a collector connected to the collector of transistor 103. As with transistor 104, transistor 404 is a pnp transistor. Transistor 404 has a collector connected to the collector of transistor 104. Unlike transistors 103 and 104 which have emitters connected to $V_{IN-}$, the emitters of transistors 403 and 404 are connected to a second end of capacitor C*. Further, unlike transistors 103 and 104 which have bases coupled to the positive input ($V_{IN+}$), the bases of transistors 403 and 404 are connected to receive a bias voltage.

The bias voltage at the base of transistor 403 is indicated as (BIAS1) and the bias voltage at the base of transistor 404 is indicated as (BIAS2). The BIAS1 and BIAS2 voltages may be any single or separate voltage which can be conveniently provided and which have no AC signal component.

In operation with the circuit of FIG. 4, the first end of the capacitance C* is directly driven by a voltage at $V_{IN+}$ and the second, low voltage end of capacitance C* enables transistors 403 and 404 to monitor return current from $V_{IN+}$. With such monitoring at least a portion of the return current can be provided to the collectors of transistors 103 and 104. With the return current provided from $V_{IN+}$ through capacitance C* and added to the current at the collector of transistors 103 and 104, the effect of the parasitic capacitance $C_{IN}$ can be eliminated. No additional subtraction circuit, such as shown in FIG. 3, is needed.

Since the capacitor C* will be small to match the capacitance $C_{IN}$, it will not substantially add to the capacitance at $V_{IN+}$. Thus, signals provided at $V_{IN+}$ will not be significantly delayed or distorted by additional input capacitance.

Although not shown, the circuit of FIG. 3 can be modified while still utilizing the capacitance compensation circuit of the present invention. For instance, resistive elements may also be utilized to couple the emitters of transistors 103 and 104 to $V_{IN+}$, instead of transistors 101 and 102. Further, compensation can be provided by substituting compensation capacitor $C_{COMP}$ with two capacitors, each having a value $½C_{COMP}$ and each being connected from the gain node G to the collector of one of respective transistors 103 and 104.

Although the invention has been described above with particularity, this was merely to teach one of ordinary skill in the art how to make and use the invention. Many modifications will fall within the scope of the invention, as that scope is defined by the claims which follow.

What is claimed is:

1. Capacitance compensation circuit for a current feedback amplifier, the current feedback amplifier having a positive input terminal ($V_{IN+}$), a negative input terminal ($V_{IN-}$) with a parasitic capacitance ($C_{IN}$) and a gain node (G) connected to an output buffer, the current feedback amplifier including a first pair of emitter follower transistors having bases coupled to the positive input ($V_{IN+}$), emitters connected to the negative input ($V_{IN-}$), and collectors coupled to the gain node (G), the capacitance compensation circuit comprising:

a capacitor (C*) having a first end connected to the positive input ($V_{IN+}$) and a second end; and a second pair of emitter follower transistors, each transistor of the second pair having a base connected to receive a bias voltage, an emitter connected to the second end of the capacitor (C*) and a collector connected to the collector of one transistor in the first pair of emitter follower transistors.

2. The capacitance compensation circuit of claim 1 wherein the capacitor (C*) has a value matching the parasitic capacitance ($C_{IN}$).

3. An current feedback amplifier having a positive input terminal ($V_{IN+}$), a negative input terminal ($V_{IN-}$) with a parasitic capacitance ($C_{IN}$) and an output terminal ($V_{OUT}$), the current feedback amplifier comprising:

a first pair of emitter follower transistors, each emitter follower transistor having a base coupled to the positive input terminal ($V_{IN+}$), an emitter connected to the negative input terminal ($V_{IN-}$), and a collector coupled to a gain node (G);

a capacitor (C*) a first end connected to the positive input ($V_{IN+}$) and a second end;

a second pair of emitter follower transistors, each emitter follower transistor having a base connected to a bias voltage, an emitter connected to the second end of the capacitor (C*) and a collector connected to the collector of one transistor of the first pair of emitter follower transistors;

an output buffer having an input connected to the gain node (G) and an output forming the output terminal ($V_{OUT}$); and a feedback circuit connecting the output terminal ($V_{OUT}$) to the negative input terminal ($V_{IN-}$).

4. The current feedback amplifier of claim 3 further comprising:

a pair of complementary transistors, each complementary transistor having a base to emitter path coupling the base of one transistor in the first pair of emitter follower transistors to the positive input ($V_{IN+}$), a collector connected to a power supply and an emitter; and a pair of current sources, each current source connected to the emitter of one transistor in the first pair of complementary transistors.

5. The current feedback amplifier of claim 3 further comprising:

a pair of current mirrors, each current mirror having an input connected to a collector of one transistor in the first pair of emitter follower transistors and an output connected to the gain node (G).

6. The current feedback amplifier of claim 3 wherein the feedback circuit comprises:

a feedback resistor ($R_F$) connected from the output terminal ($V_{OUT}$) to the negative input terminal ($V_{IN-}$); and a gain resistor ($R_G$) connected from the negative input terminal ($V_{IN-}$) to a power supply.

7. The current feedback amplifier of claim 3 wherein the capacitor (C*) has a value matching the parasitic capacitance ($C_{IN}$).

8. A current feedback amplifier having a positive input terminal ($V_{IN+}$), a negative input terminal ($V_{IN-}$) with a parasitic capacitance ($C_{IN}$) and an output terminal ($V_{OUT}$), the current feedback amplifier comprising:

a first pair of complementary transistors, each complementary transistor having a base connected to the positive input ($V_{IN+}$), a collector connected to a power supply and an emitter;

a pair of current sources, each current source connected to the emitter of one of the transistors of the first pair of complementary transistors;

a first pair of emitter follower transistors, each emitter follower transistor having a base connected to the emitter of a complementary transistor in the first pair of complementary transistors, an emitter connected to form the negative input ($V_{IN-}$), and a collector;

a capacitor (C*) having a value matched to the parasitic capacitance ($C_{IN}$), a first end connected to the positive input ($V_{IN+}$) and a second end;

a second pair of emitter follower transistors, each emitter follower transistor having a base connected to a bias voltage, an emitter connected to the second end of the capacitor (C*) and a collector connected to the collector of one transistor of the first pair of emitter follower transistors;

a pair of current mirrors, each current mirror having an input connected to a collector of one transistor of the first pair of emitter follower transistors and an output coupled to a gain node (G);

an output buffer having an input connected to the gain node (G) and an output forming the output terminal ($V_{OUT}$); and a feedback circuit comprising a feedback resistor ($R_F$) connected from the output terminal ($V_{OUT}$) to the negative input terminal ($V_{IN-}$) and a gain resistor ($R_G$) connected from the negative input terminal ($V_{IN-}$) to a power supply.

\* \* \* \* \*